(12) United States Patent
Anceau et al.

(10) Patent No.: US 6,759,726 B1
(45) Date of Patent: *Jul. 6, 2004

(54) FORMATION OF AN ISOLATING WALL

(75) Inventors: Christine Anceau, Saint Roch (FR); Fabien Pierre, Cesson Sevigne (FR); Olivier Bonnaud, Cesson Sevigne (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/426,822

(22) Filed: Oct. 22, 1999

(30) Foreign Application Priority Data

Oct. 23, 1998 (FR) .............................. 98 13544

(51) Int. Cl.⁷ .................... H01L 21/336; H01L 21/8238
(52) U.S. Cl. ...................... 257/505; 257/499; 257/538; 257/543; 257/545
(58) Field of Search ................................ 257/499–506, 257/538, 543, 545, 554; 438/218, 219, 294, 332

(56) References Cited

U.S. PATENT DOCUMENTS

| 4,021,270 A | * | 5/1977 | Hunt et al. .................. 148/1.5 |
| 4,188,245 A | | 2/1980 | Chang et al. ............... 148/188 |
| 4,219,373 A | | 8/1980 | Mochizuki et al. .......... 148/187 |
| 4,711,017 A | * | 12/1987 | Lammert ...................... 437/20 |
| 5,401,984 A | * | 3/1995 | Byatt et al. .................. 257/499 |
| 5,468,976 A | | 11/1995 | Evseev et al. ............... 257/177 |
| 5,485,027 A | * | 1/1996 | Williams et al. ............ 257/343 |
| 5,652,456 A | * | 7/1997 | Lien ........................... 257/370 |
| 6,114,729 A | * | 9/2000 | Park et al. ................... 257/349 |
| 6,252,257 B1 | * | 6/2001 | Duclos et al. ............... 257/119 |

FOREIGN PATENT DOCUMENTS

FR         A-2 410 363         11/1977        ........... H01L/21/76

OTHER PUBLICATIONS

French Search Report from French Patent Application No. 98 13544, filed Oct. 23, 1998.
Patent Abstracts of Japan, vol. 014, No. 457 (E–0986), Oct. 2, 1990 & JP–A–02 184026 (Sharp Corp.).

* cited by examiner

*Primary Examiner*—Jerome Jackson
*Assistant Examiner*—Jesse G. Fenty
(74) *Attorney, Agent, or Firm*—Lisa K. Jorgenson; James H. Morris; Wolf, Greenfield & Sacks, P.C.

(57) ABSTRACT

A method of forming an isolating wall in a semiconductor substrate of a first conductivity type, including the steps of boring in the substrate separate recesses according to the desired isolating wall contour; filling the recesses with a material containing a dopant of the second conductivity type; and performing an anneal step so that regions of the second conductivity type diffused from neighboring recesses join. A first series of recesses is formed from the upper surface and a second series of recesses is formed from the lower surface. The recesses have a substantially rectangular section, the large dimension of which is perpendicular to the alignment of the recesses and a depth smaller than or equal to the half-thickness of the substrate.

18 Claims, 3 Drawing Sheets

FORMATION OF AN ISOLATING WALL

BACKGROUND OF THE INVENTION

1. Field of the Invention

The present invention relates to the manufacturing of semiconductor components, and more specifically, of power semiconductor components.

2. Discussion of the Related Art

As semiconductor components, and especially semiconductor power components, have more and more complex structures, various components which have to be laterally isolated from one another are now often located on the same semiconductive chip. The case where this isolation is performed by providing isolating walls of a conductivity type opposite to that of the substrate will be considered herein.

In the field of power components, a specific problem arises due to the fact that the isolating walls have to be deep and to cross an entire silicon wafer. Conventionally, these isolating walls are made by opposite drive-ins formed from the upper and lower surfaces of a silicon wafer.

FIG. 1 shows, in cross-section, and FIG. 2 shows, in top view, a portion of an N-type semiconductive wafer 1 in which are formed isolating walls to delimit a portion 2 of the semiconductive region. The isolating walls are generally made by providing masks 3 having openings 4 and 5 facing the upper and lower surfaces of the semiconductive wafer according to the desired contour of the isolating wall. Then, diffusions of a type opposite to that of the substrate, herein, type P, respectively 6 and 7, sufficiently deep to join, are formed from these openings.

The forming time of these diffused walls is very long and the processing temperature has to be very high. Thus, wafers which are as thin as possible tend to be used to reduce the duration of this step. In the case of a wafer having a thickness of 200 µm (A), diffusions having a depth of, for example, 125 µm, will have to be provided to be sure that the opposite diffusions join properly. With a boron doping in an N-type substrate, this operation requires a thermal processing of 300 hours at 1280° C.

Another disadvantage of forming an isolating wall by diffusion from the upper and lower surfaces is the surface occupied by the obtained wall. Indeed, during a diffusion step, a lateral diffusion substantially occurs at the same rate as the transversal diffusion. Thus, if it is desired to make a diffusion of a 125-µm depth, this diffusion will also laterally extend over a 125-µm length. As indicated in FIG. 1, if opening 4 has a width on the order of 50 µm (C), the total width of the isolating wall will be on the order of 300 µm (B). For a wafer of a 300-µm (B) thickness, this width would become greater than 500 µm (0.5 mm), while the width of the area where the isolating walls join in the median plane of the wafer only is of some tens of micrometers.

Such isolating wall dimensions are far from being negligible in practice. Indeed, knowing that a conventional vertical power structure such as that of a thyristor operates with a mean current density of 2 A/mm$^2$, a component meant to conduct a current on the order of 2 A will have a surface of 1 mm$^2$ while an isolating wall surrounding said component will have a surface on the order of 1.56 mm$^2$. Thus, the isolating wall occupies more silicon surface than the component itself. A component intended for conducting a current of 10 A will have an active surface of 5 mm$^2$ and its isolating wall will occupy a surface of 3 mm$^2$. The silicon surface increase due to the wall will be, in this case, 60%.

FIGS. 3A to 3C are cross-sectional views of a semiconductor substrate illustrating successive steps of formation of another known type of isolating wall and FIG. 4 shows a top view thereof.

As shown in FIG. 3A, in a first step, cylindrical wells 11 are bored in a silicon substrate. With known methods, holes of a diameter from 1 to 5 µm can be obtained.

As shown in FIG. 4, holes 11 are aligned and spaced apart from one another according to the contour of the isolating wall which is desired to be obtained.

In a second step illustrated in FIG. 3B, holes 11 are filled with a material 12 which can be used as a source for a dopant of type opposite to that of the substrate. For example, if the substrate is of type N, this dopant may be boron and material 12 may be boron-doped polysilicon. The filling of the holes may be performed by low pressure vapor phase chemical deposition.

In a third step, illustrated in FIG. 3C, the wafer is submitted to a thermal processing so that the P-type dopant included in material 12 diffuses from walls of cylindrical holes 11 and this diffusion is carried on until diffused regions 13 of two adjacent holes join.

The obtained result is illustrated as an example in FIG. 4. It should be noted that thickness w of the obtained isolating wall only depends on the diameter of holes 11 and on the distance between these holes. By choosing, for example, holes of a 5-µm diameter spaced apart by 20 µm, a diffusion step providing a diffused region of a 12.5-µm extension can be performed, that is, the greatest width of the isolating wall will be equal to 5+2×12.5=30 µm. Those skilled in the art will choose the dimension and the distance between holes according to the diffusion duration that its manufacturing process can admit. It should be noted as an example that the duration required to obtain a diffusion of a 10-µm length with boron is 10 hours at 1200° C. The thermal processing thus is much less constraining as previously.

Thus, the method of wall creation by boring of holes has, with respect to the diffusion method, the advantage of a smaller bulk. It however has the disadvantage that, in many cases, the isolating wall still has to have a given thickness and a minimum doping level at the locations where the diffusions from two parallel holes join. To solve this problem, systems including several parallel lines of holes have been provided in prior art. However, these systems have the disadvantage of embrittling the silicon wafer and difficult compromises have to be made between the choice of the distance between parallel holes and the choice of the anneal duration.

Thus, each of the above-mentioned prior systems has disadvantages.

SUMMARY OF THE INVENTION

The present invention aims at overcoming one or several of the disadvantages of prior systems.

More specifically, the present invention provides manufacturing efficient isolating walls, having a small useless width only in addition to their useful width, and relatively simple and fast to manufacture.

To achieve these and other objects, the present invention provides a method of manufacturing an isolating wall in a semiconductor substrate of a first conductivity type, including the steps of boring in the substrate separate recesses according to the desired isolating wall contour; filling the recesses with a material containing a dopant of the second conductivity type; performing an anneal step so that regions of the second conductivity type diffused from neighboring recesses join; and forming a first series of recesses from the upper surface and a second series of recesses from the lower surface, the recesses having a substantially rectangular section, the large dimension of which is perpendicular to the alignment of the recesses and a depth smaller than or equal to the half-thickness of the substrate.

According to an embodiment of the present invention, the first and second series of recesses, seen in projection perpendicularly to the substrate plane, are alternated.

According to an embodiment of the present invention, the recesses are formed by dry etch.

The present invention also provides an isolating wall of the second conductivity type in a substrate of a first conductivity type, including lines of recesses filled with a doped material of the second conductivity type and diffused regions of the second conductivity type extending around each recess, with the areas corresponding to two neighboring recesses joining. A first series of recesses extends from the upper surface and a second series of recesses extends from the lower surface. The recesses have a rectangular section, the large dimension of which is perpendicular to the recess line and have a depth smaller than or equal to the substrate half-thickness.

According to an embodiment of the present invention, the first and second series of recesses, seen in projection perpendicularly to the substrate plane, are alternated.

The present invention also provides a component including an isolating wall of the above type.

The foregoing objects, features and advantages of the present invention, will be discussed in detail in the following non-limiting description of specific embodiments in connection with accompanying drawings.

DETAILED DESCRIPTION

Figure 5A:
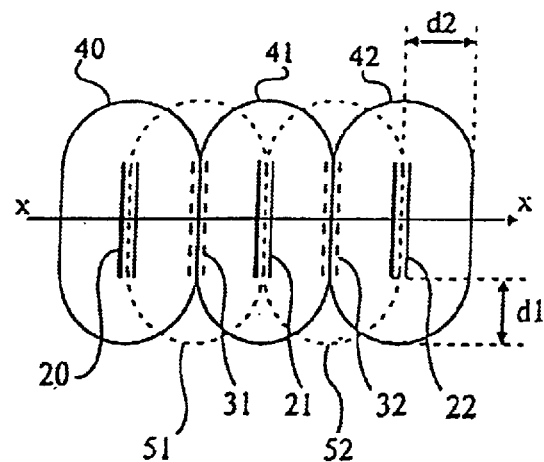
FIGS. 5A and 5B respectively show a simplified top view and a simplified cross-sectional view of a portion of an isolating wall according to the present invention.
Figure 5B:
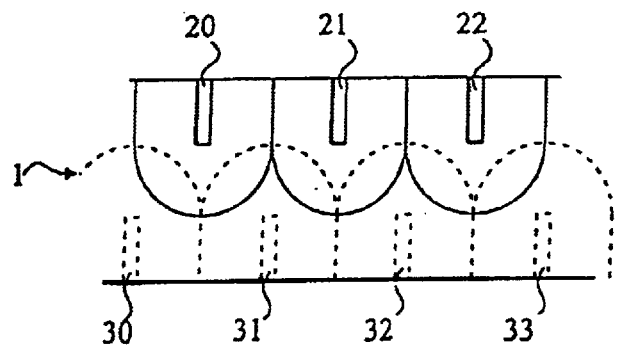

As shown in FIGS. 5A and 5B, an isolating wall according to the present invention is formed based on a succession of aligned recesses 20, 21, 22 . . . formed on the upper surface side of a semiconductive wafer and of a succession of aligned recesses 30, 31, 32, 33 . . . formed on the lower surface side of the semiconductive wafer. Lines X—X connecting the centers of the recesses on the upper surface side and on the lower surface side are confounded according to a projection perpendicular to the semiconductive wafer plane. Each of recesses 20–22, 30–33 has a rectangular section, the large direction of which is perpendicular to line X—X.

According to a feature of the present invention which is visible in FIG. 5B, the depth of the recesses is smaller than or equal to the half-thickness of the wafer and the upper and lower recesses are arranged alternately.

The recesses are, for example, formed by sequential dry etch on the upper surface side, then on the lower surface side of the substrate.

Figure 1:
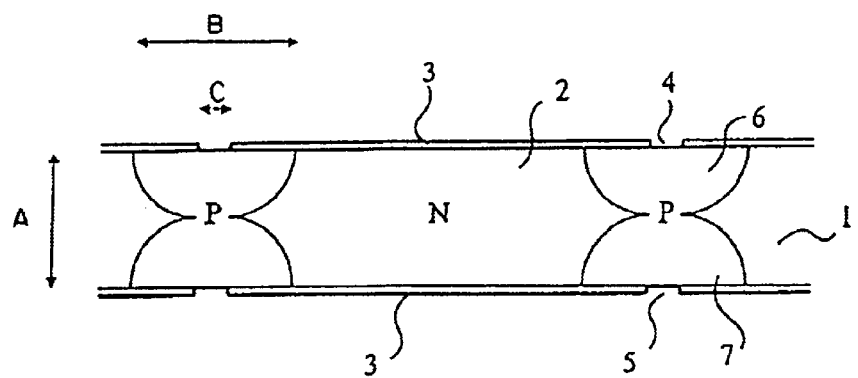
FIGS. 1 and 2 illustrate, in cross-section and in top view, a conventional isolating wall obtained by diffusion.
Figure 2:
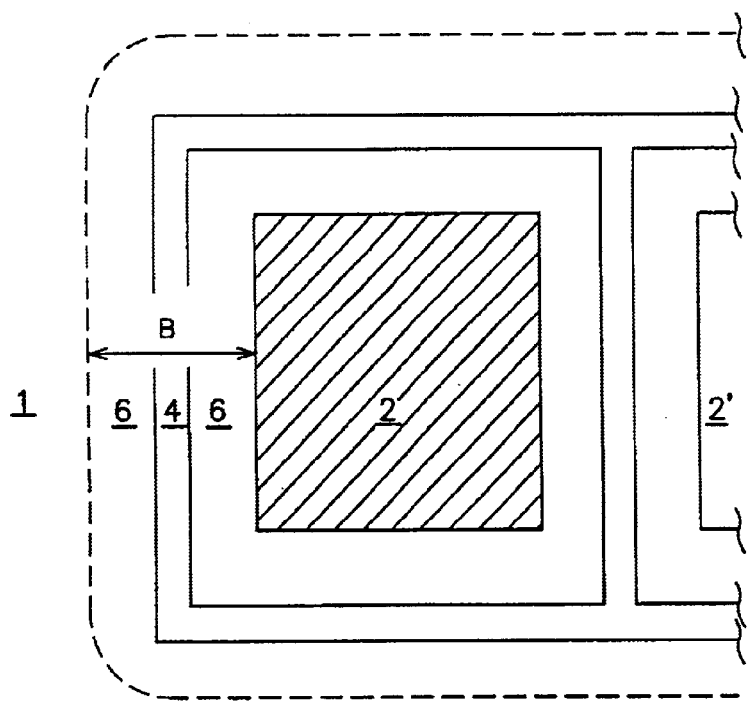
Figure 3A:
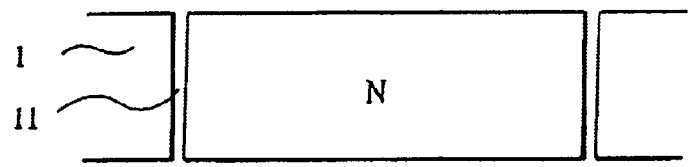
FIGS. 3A to 3C are cross-sectional views of a semiconductor substrate illustrating successive steps of formation of another known type of isolating wall.
Figure 3B:
Figure 3C:
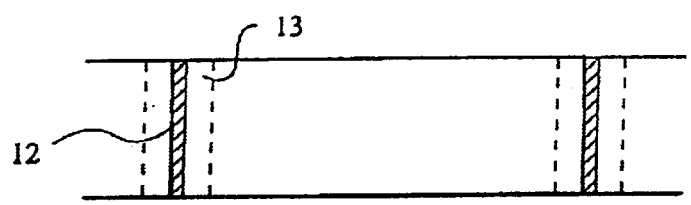
Figure 4:
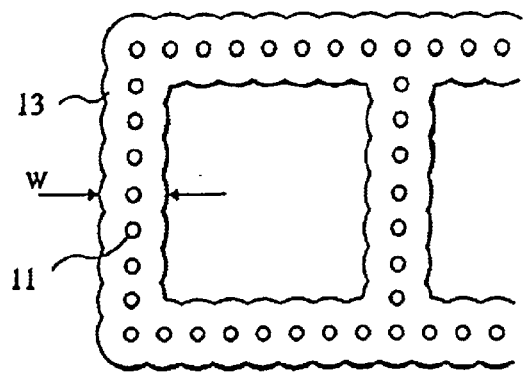
FIG. 4 shows a top view of the isolating wall obtained by the method of FIGS. 3A to 3C.

Then, as described in relation with FIGS. 3B and 3C, the recesses are filled with a source of a dopant of a type opposite to that of the substrate, for example, boron-doped polysilicon, and the dopant is made to diffuse. Thus, recesses 20–22 are the source of respective diffused regions 40–42, while recesses 31–32 on the lower surface side are the source of respective diffused regions 51–52. The diffusion is carried on for sufficiently long for the diffused areas extending from two neighboring recesses on a same surface to join. Also, as can be seen from the cross-sectional view, these diffusions are carried on for sufficiently long for the diffused regions from neighboring recesses of the upper and lower substrate surfaces to join.

According to an advantage of the present invention, it has been acknowledged that, when a diffusion is formed from a rectangular area, diffusion distance d1 in the direction of the large side of the rectangle is smaller than diffusion distance d2 on the small side of the rectangle (see FIG. 5A), which ensure a good closing of the isolating wall for a limited diffusion duration.

Figure 6:
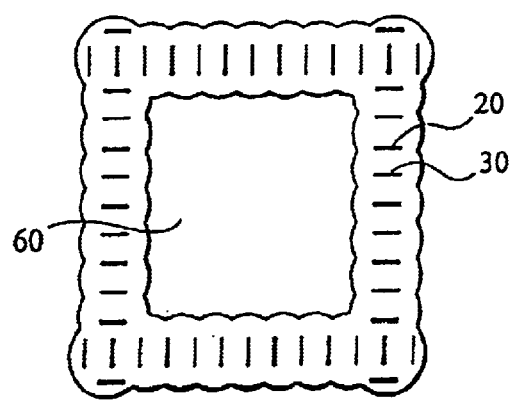
FIG. 6 is a simplified top view at a larger scale of an isolating wall according to the present invention.

FIG. 6 shows a top view of an area 60 of a semiconductor substrate surrounded with a wall obtained according to the present invention. A thicker line has been used to designate recesses 20 formed on the upper surface side of the substrate and a thinner line has been used for recesses 30 formed on the lower surface side of the substrate.

Of course, the present invention is likely to have various alterations, modifications, and improvements which will readily occur to those skilled in the art. In particular, other materials for filling the recesses may be chosen, the only requirement being that these materials can be used as a dopant source of type opposite to that of the substrate and can be made to fill the recesses by a relatively simple method such as a vapor-phase chemical deposition. Other shapes such as mere rectangles may also be chosen. Various designs may be chosen for the wall corners, for example, roundings.

As an example only, for a wafer of a thickness from 210 to 220 $\mu$m, a depth of 100 $\mu$m, a length of 20 to 40 $\mu$m, and a width of 2 to 4 $\mu$m may be chosen for each recess 20–22, 30–33, the distance between neighboring openings on a same side of the wafer being 15 to 30 $\mu$m.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing an isolating wall in a semiconductor substrate of a first conductivity type, including the steps of:

boring in the substrate separate recesses according to the desired isolating wall contour;

filling the recesses with a material containing a dopant of the second conductivity type;

annealing so that regions of the second conductivity type diffused from neighboring recesses join;

wherein a first series of recesses is formed from the upper surface and a second series of recesses is formed from the lower surface, the recesses having a substantially rectangular section, a large dimension of which is perpendicular to an alignment of the recesses and a depth smaller than or equal to a half-thickness of the substrate.

2. The method of claim 1, wherein the first and second series of recesses, seen in projection perpendicularly to the substrate plane, are alternated.

3. The method of claim 1, wherein the recesses are formed by dry etch.

4. An isolating wall of a second conductivity type in a substrate of a first conductivity type, including lines of recesses filled with a doped material of the second conductivity type and diffused regions of the second conductivity type extending around each recess, with areas corresponding to two neighboring recesses joining, wherein a first series of recesses extends from the upper surface and a second series of recesses extends from the lower surface, and wherein the recesses have a rectangular section, the large dimension of which is perpendicular to the recess line and have a depth smaller than or equal to the substrate half-thickness.

5. The isolating wall of claim 4, wherein the first and second series of recesses, seen in projection perpendicularly to the substrate plane, are alternated.

6. A semiconductor component including an isolating wall according to claim 4.

7. A method for forming an isolating barrier in a semiconductor substrate of a first dopant type, the method comprising acts of:
  (A) forming a first recess in an upper portion of the semiconductor substrate, the first recess having a rectangular-shaped opening and extending less than half of a thickness of the semiconductor substrate;
  (B) forming a second recess in a lower portion of the semiconductor substrate, the second recess having a rectangular-shaped opening and extending less than half of the thickness of the semiconductor substrate;
  (C) filling the first and second recesses with a material containing a second dopant type;
  (D) forming a first diffusion region of the second dopant type, the first diffusion region being contiguous with the first recess;
  (E) forming a second diffusion region of the second dopant type, the second diffusion region being contiguous with the second recess and the first diffusion region; and
  (F) forming a third recess, parallel to the first recess, in an upper portion of the semiconductor substrate, the third recess having a rectangular-shaped opening and extending less than half of the thickness of the semiconductor substrate;
  wherein the act of forming the second recess includes forming the second recess between the first and third recesses.

8. The method of claim 7, wherein the act (D) includes an act of forming a first diffusion region of a second dopant type by annealing the semiconductor substrate.

9. The method of claim 8, wherein the act (E) includes an act of forming a second diffusion region of a second dopant type by annealing the semiconductor substrate.

10. The method of claim 7, wherein the act (A) includes an act of forming a first recess by dry etching the semiconductor substrate.

11. The method of claim 10, wherein the act (B) includes an act of forming a second recess by dry etching the semiconductor substrate.

12. The method of claim 7, further comprising an act of:
  (G) forming a fourth recess, parallel to the second recess, in a lower portion of the semiconductor substrate, the fourth recess having a rectangular-shaped opening and extending less than half of the thickness of the semiconductor substrate.

13. The method of claim 7, wherein the semiconductor substrate is N-type and wherein the act of (C) includes an act of filling the first and second recesses with a material containing a P-type dopant.

14. A method for forming an isolating barrier in a semiconductor substrate of a first dopant type, the method comprising acts of:
  (A) forming a first recess in an upper portion of the semiconductor substrate, the first recess having a rectangular-shaped opening and extending less than half of a thickness of the semiconductor substrate;
  (B) forming a second recess in a lower portion of the semiconductor substrate, the second recess having a rectangular-shaped opening and extending less than half of the thickness of the semiconductor substrate;
  (C) filling the first and second recesses with a material containing a second dopant type;
  (D) forming a first diffusion region of the second dopant type, the first diffusion region being contiguous with the first recess; and
  (E) forming a second diffusion region of the second dopant type, the second diffusion region being contiguous with the second recess and the first diffusion region;
  wherein the act of forming the second recess includes forming the second recess substantially equidistant from the first and third recesses.

15. An isolating barrier in a semiconductor substrate of a first dopant type, the isolating barrier comprising:
  a first recess in an upper portion of the semiconductor substrate, the first recess containing a material of a second dopant type, having a rectangular-shaped opening, and extending less than half of a thickness of the semiconductor substrate;
  a second recess in a lower portion of the semiconductor substrate, the second recess containing the material of the second dopant type, having a rectangular-shaped opening, and extending less than half of the thickness of the semiconductor substrate;
  a first diffusion region of the second dopant type contiguous with the first recess;
  a second diffusion region of the second dopant type, the second diffusion region being contiguous with the second recess and with the first diffusion region; and
  a third recess, parallel to the first recess, in an upper portion of the semiconductor substrate, the third recess having a rectangular-shaped opening and extending less than half of the thickness of the semiconductor substrate wherein the second recess is disposed between the first and third recesses.

16. The semiconductor substrate of claim 15, further comprising a fourth recess, parallel to the second recess, in a lower portion of the semiconductor substrate, the fourth recess having a rectangular-shaped opening and extending less than half of the thickness of the semiconductor substrate.

17. The semiconductor substrate of claim 15, wherein the first dopant type is N-type and the second dopant type is P-type.

18. An isolating barrier in a semiconductor substrate of a first dopant type, the isolating barrier comprising:
- a first recess in an upper portion of the semiconductor substrate, the first recess containing a material of a second dopant type, having a rectangular-shaped opening, and extending less than half of a thickness of the semiconductor substrate;
- a second recess in a lower portion of the semiconductor substrate, the second recess containing the material of the second dopant type, having a rectangular-shaped opening, and extending than half of the thickness of the semiconductor substrate;
- a first diffusion region of the second dopant type contiguous with the first recess; and
- a second diffusion region of the second dopant type, the second diffusion region being contiguous with the second recess and with the first diffusion region;
- wherein the second recess is disposed substantially equidistant from the first and third recesses.

* * * * *

UNITED STATES PATENT AND TRADEMARK OFFICE
CERTIFICATE OF CORRECTION

PATENT NO.    : 6,759,726 B1
DATED         : July 6, 2004
INVENTOR(S)   : Christine Anceau, Fabien Pierre and Olivier Bonnaud It is certified that error appears in the above-identified patent and that said Letters Patent is hereby corrected as shown below:

Column 3,
Line 34, should read:
-- tion with the accompanying drawings --

Column 8,
Line 1, should read:
-- opening, and extending less than half of the thickness of the --

Signed and Sealed this

Seventeenth Day of August, 2004

JON W. DUDAS
*Acting Director of the United States Patent and Trademark Office*